United States Patent
Ide et al.

(10) Patent No.: US 7,737,607 B2
(45) Date of Patent: Jun. 15, 2010

(54) ACTUATOR HAVING FIRST AND SECOND ELECTRODES AND DEFORMABLE JOINING MEMBER AND METHOD FOR MOUNTING ACTUATOR

(75) Inventors: Takayuki Ide, Fussa (JP); You Kondoh, Yamato (JP)

(73) Assignee: Olympus Corporation, Tokyo (JP)

( * ) Notice: Subject to any disclaimer, the term of this patent is extended or adjusted under 35 U.S.C. 154(b) by 292 days.

(21) Appl. No.: 11/904,217

(22) Filed: Sep. 26, 2007

(65) Prior Publication Data
US 2008/0074003 A1   Mar. 27, 2008

(30) Foreign Application Priority Data
Sep. 26, 2006  (JP)  ............................. 2006-260938

(51) Int. Cl.
*H01L 41/08*  (2006.01)
(52) U.S. Cl. ........................ 310/328; 310/325
(58) Field of Classification Search ................ 310/328, 310/354
See application file for complete search history.

(56) References Cited

U.S. PATENT DOCUMENTS

| | | | | |
|---|---|---|---|---|
| 4,267,480 A | * | 5/1981 | Kanematsu et al. | 310/366 |
| 4,608,509 A | * | 8/1986 | Yamamoto et al. | 310/357 |
| 6,046,530 A | * | 4/2000 | Funaki | 310/354 |
| 6,081,066 A | * | 6/2000 | Tsutsui | 310/348 |
| 6,111,338 A | * | 8/2000 | Otsuchi et al. | 310/352 |
| 6,384,493 B1 | * | 5/2002 | Okamoto | 310/12.27 |
| 6,543,108 B1 | * | 4/2003 | Itasaka | 29/25.35 |

FOREIGN PATENT DOCUMENTS

JP   2004-282992   10/2004

* cited by examiner

*Primary Examiner*—J. SanMartin
(74) *Attorney, Agent, or Firm*—Scully, Scott, Murphy & Presser, P.C.

(57) ABSTRACT

Temporary assembling is carried out by inserting an ion conducting actuator into a groove which is provided at a central portion of a substrate. Thereafter, a bump is pressed by forcing in a direction of a surface of the substrate while carrying out leveling and thrust control, by a flat portion of a pedestal having a recess which is provided such that the ion conducting actuator is not crushed. At this time, due to a deformation of the bump which is pressed, the electrical connections are carried out assuredly, and the ion conducting actuator is held mechanically by both sides.

16 Claims, 15 Drawing Sheets

ACTUATOR HAVING FIRST AND SECOND ELECTRODES AND DEFORMABLE JOINING MEMBER AND METHOD FOR MOUNTING ACTUATOR

CROSS-REFERENCE TO RELATED APPLICATION

The present application is based upon and claims the benefit of priority from the prior Japanese Patent Application No. 2006-260938 filed on Sep. 26, 2006; the entire contents of which are incorporated herein by reference.

BACKGROUND OF THE INVENTION

1. Field of the Invention

The present invention relates to a mounting structure of an actuator, and a method for mounting an actuator.

2. Description of the Related Art

In recent years, in fields such as medical equipments, industrial robots, and micro machines, research and development of actuators in which various principles of operation are applied have been carried out. Among these, an actuator element in which, an electrode is formed on a surface of an ion exchange resin in a form in which polar molecules such as an ion fluid included, and is deformed by bending by applying a voltage has been called as an artificial muscle for its flexible driving mode. A structure of the actuator being simple, it is expected to have applications in various fields from now onward. For example, in Japanese Patent Application Laid-open Publication No. 2004-282992, examples of structures of various actuators have been described.

However, in Japanese Patent Application Laid-open Publication No. 2004-282992 mentioned above, although examples of structures of various actuators have been described, there has been no mention about a mounting structure of an actuator.

Moreover, in a conventional mounting structure of making electrical connections and mechanical connections of an actuator, an actuator which includes an electrode for driving for example, due to a demand for stable electrical connections, have a structure different from the mechanical connections, and the mounting structure of the actuator has been complex.

SUMMARY OF THE INVENTION

The present invention is made in view of the abovementioned circumstances, and an object of the present invention is to provide a mounting structure of an actuator which is simple and low cost, and capable of attaining stable and assured electrical connections and mechanical connections, and a method for mounting an actuator.

For solving the abovementioned issues, and achieving the object, according to a first aspect of the present invention, there is provided a mounting structure of an actuator which includes an actuator which has a first electrode, a substrate which has a second electrode, and a joining member which is deformable and electroconductive, and the joining member is pressed toward the substrate, and via a deformation of the joining member toward the actuator, the actuator and the substrate are connected mechanically, and the first electrode and the second electrode are connected electrically.

According to a preferable aspect of the present invention, it is desirable that the first electrode of the actuator is provided on each of a front surface and a rear surface.

Moreover, according to a preferable aspect of the present invention, it is desirable that a plurality of joining members is formed to be facing mutually on the substrate, sandwiching the actuator.

Furthermore, according a preferable aspect of the present invention, it is preferable that the joining member is pressed, and the joining member is deformed in a direction substantially perpendicular to a direction in which the joining member is pressed, and pinches the actuator.

According to a preferable aspect of the present invention, it is desirable that the joining member is an electroconductive bump formed by a bump formation method.

Moreover, according to a preferable aspect of the present invention, it is desirable that the electroconductive bumps are formed to be stacked in a plurality of stages facing mutually, sandwiching a body which is mounted.

Furthermore, according to a preferable aspect of the present invention, it is desirable that the actuator is an ion conducting actuator which includes a base material which is made of a high-polymer material, and facing electrodes which are formed on a surface of the base material.

According to a preferable aspect of the present invention, it is desirable that the joining member pinches the actuator by deforming at least a part of the facing electrodes.

Moreover, according to a preferable aspect of the present invention, it is desirable that the second electrode and the electroconductive bumps are formed of a noble metal such as gold and platinum.

According to a second aspect of the present invention, there can be provided a mounting structure of an actuator which includes an actuator which has a first electrode, a substrate which has a second electrode, and a joining member which is deformable and electroconductive, and the joining member is pressed toward the substrate, and via a deformation of the joining member toward the actuator, the actuator and the substrate are connected mechanically, and the first electrode and the second electrode are connected electrically, and the first electrode of the actuator is provided on each of a front surface and a rear surface, and a plurality of joining members are formed to be mutually facing on the substrate, sandwiching the actuator, and the joining member is pressed, and is deformed in a direction perpendicular to a direction in which the joining member is pressed, and pinches the actuator, and the joining member is an electroconductive bump formed by a bump formation method, and the electroconductive bumps are formed to be stacked in a plurality of stages facing mutually, pinching the actuator.

According to a third aspect of the present invention, there can be provided a method for mounting an actuator in which, an actuator having a first electrode is mounted on a substrate having a second electrode, which includes a pressing step at which, a joining member which is deformable and electroconductive is pressed toward the substrate, a deformation step at which, the joining member is deformed toward the actuator, and a connecting step at which, the actuator and the substrate are connected mechanically, and the first electrode and the second electrode are connected electrically, by the joining member which is deformed.

DETAILED DESCRIPTION OF THE INVENTION

Embodiment of the present invention will be described below in detail by referring to accompanying diagrams. However, the present invention is not restricted to these embodiments.

First Embodiment

In a first embodiment, an object to be mounted which is to be mounted mechanically and connected electrically is an ion conducting actuator. First of all, a driving principle of the ion conducting actuator will be described below. However, the present invention is not restricted to the first embodiment.

Figure 1:
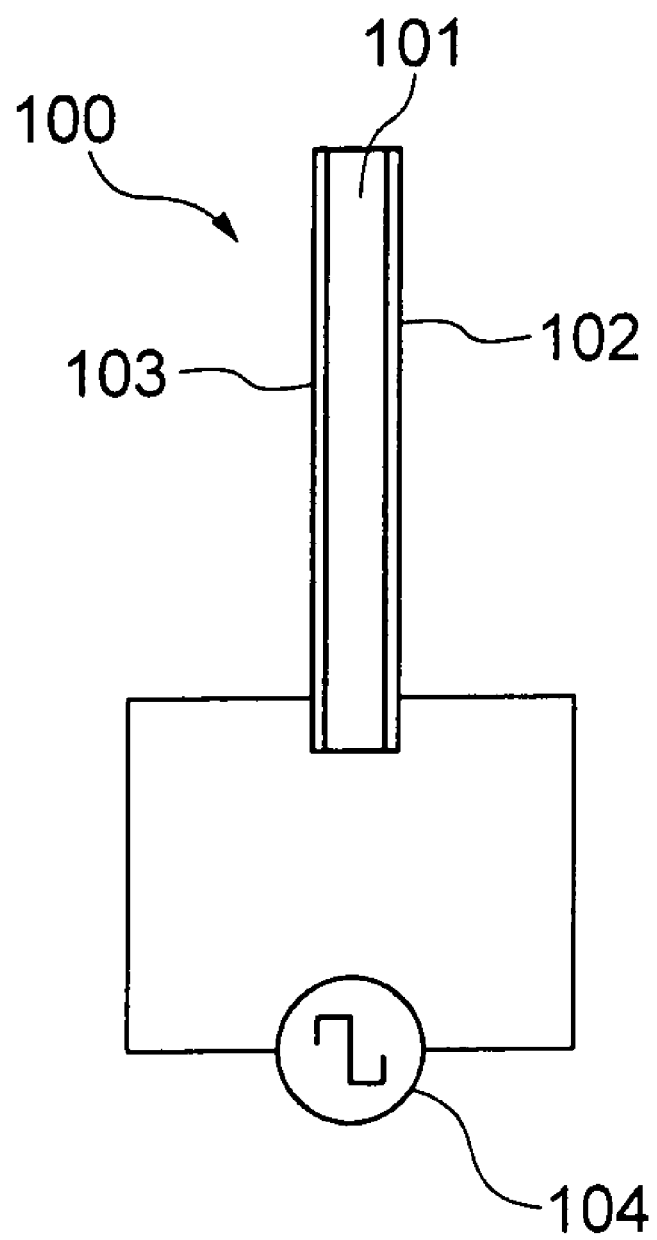
FIG. 1 is a diagram showing an example of a structure of an ion conducting actuator according to a first embodiment of the present invention.

As shown in FIG. 1, an ion conducting actuator 100 includes a base material 101 made of an ion exchange resin, containing ion and/or polar molecules which are movable according to an electric field, and facing electrodes 102 and 103 which are formed on a surface of the base material 101 by an electroless plating method (non-electrolytic plating method).

Figure 2A:
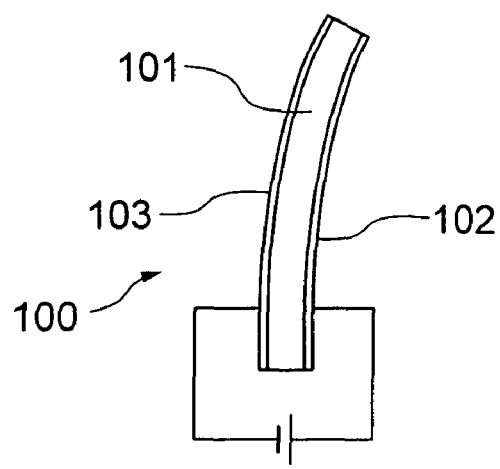
FIG. 2A and FIG. 2B are diagrams describing a method for driving the ion conducting actuator according to the first embodiment.

Moreover, a deformed state of the ion conducting actuator 100 when a positive and a negative voltage are applied to the facing electrodes 102 and 103 respectively by applying a voltage to the facing electrodes 102 and 103 by a power supply 104 is as shown in FIG. 2A, and due to an electric field generated by the voltage applied, positive ions and/or polar molecules in the base material 101 move toward a negative pole, and due to this, the negative pole side is swollen as compared to a positive pole side, and a front end of the base material 101 is deformed toward a right side in the diagram.

Figure 2B:
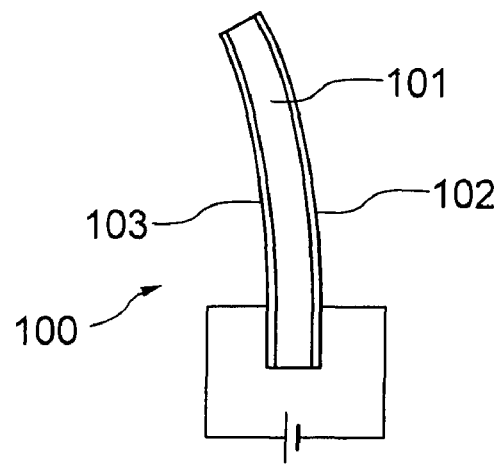

Moreover, when reverse voltage is applied, as shown in FIG. 2B, due to the generation of electric field by the voltage applied, positive ions and/or polar molecules in the base material 101 move toward the negative pole, and the negative pole side is swollen as compared to the positive pole side, and the front end of the base material 101 moves toward a left side in the diagram. In this manner, the ion conducting actuator 100 is an actuator in which a deformation of the base material 101 caused due to the voltage applied to the facing electrodes is used.

Figure 3:
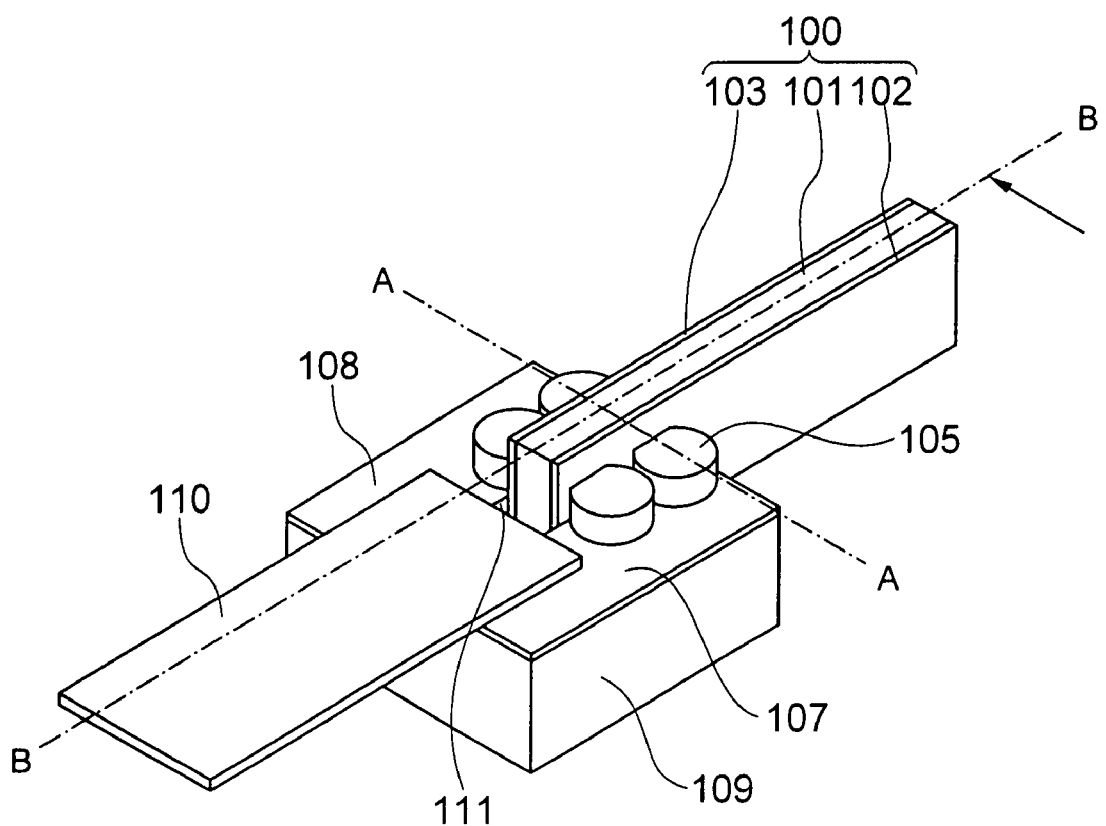
FIG. 3 is a perspective view of electrical connections and a mechanical mounting structure of the ion conducting actuator according to the first embodiment.
Figure 4:
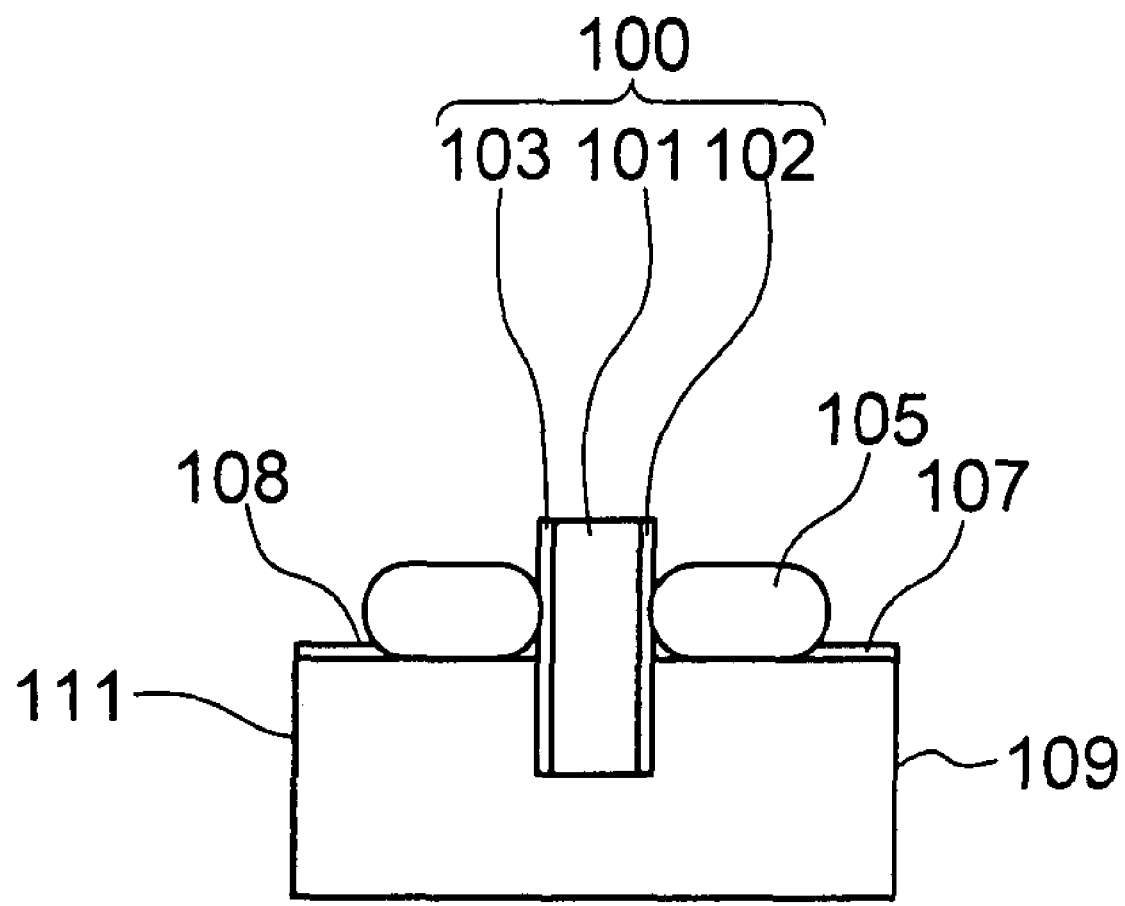
FIG. 4 is an A-A cross-sectional view in FIG. 3.
Figure 5:
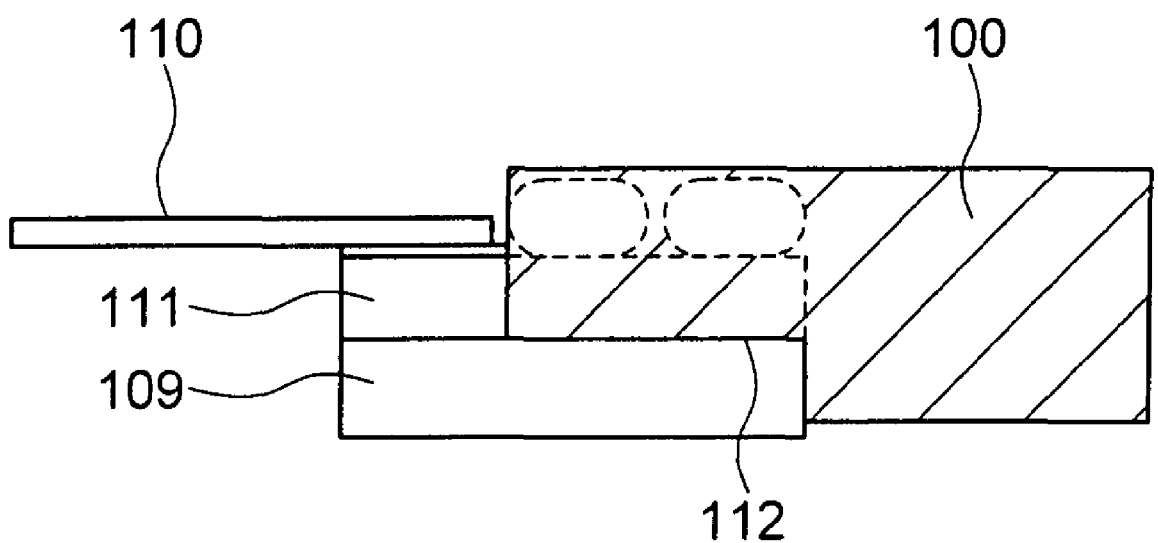
FIG. 5 is a B-B cross-sectional front view in FIG. 3.
Figure 6:
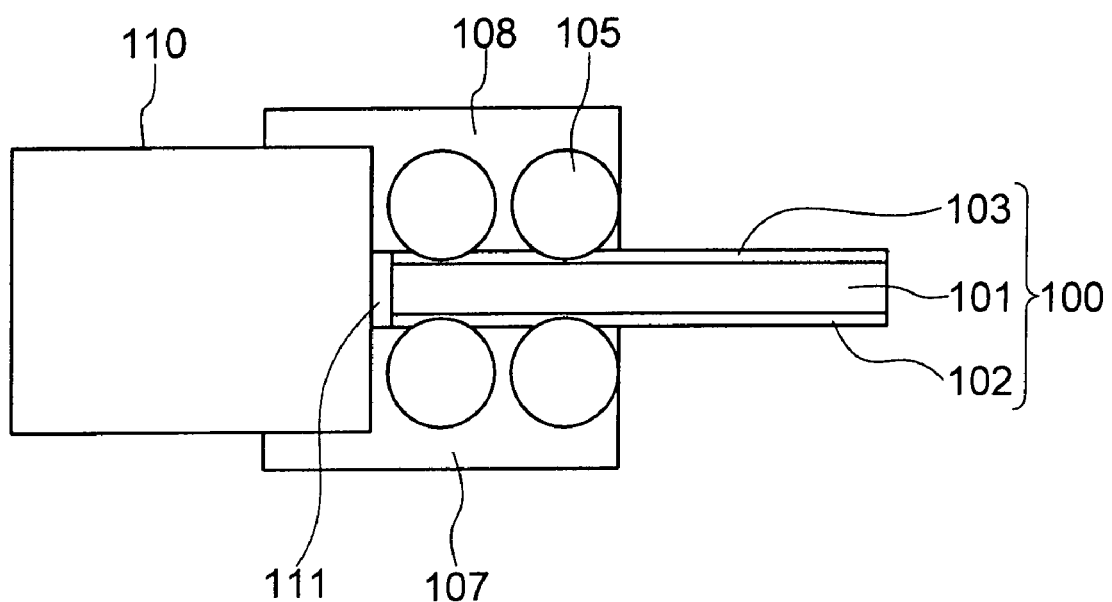
FIG. 6 is a top view of the electrical connections and the mechanical mounting structure of the ion conducting actuator according to the first embodiment.

Next, electrical connections and a mechanical mounting structure of the actuator according to the first embodiment will be described by using FIG. 3 to FIG. 6. FIG. 3 is a perspective view of the electrical connections and the mechanical mounting structure of the ion conducting actuator according to the first embodiment. FIG. 4 is a cross-sectional view along A-A in FIG. 3. FIG. 5 is a cross-sectional front view along B-B in FIG. 3. FIG. 6 is a top view.

As shown in FIG. 3, the electrical connections and the mechanical mounting structure of the ion conducting actuator include a substrate 109 which has electrodes 107 and 108 on a surface, and a groove 111 in which is provided by a method such as dicing, the ion conducting actuator 100 which has bumps 105 provided on, the substrate 109, and facing electrodes 102 and 103 provided on a front surface and a rear surface, and a flexible circuit board 110.

As shown in FIG. 4, the substrate 109 has the groove 111 provided in a central portion by a method such as dicing, and the ion conducting actuator 100 is inserted into the groove 111 such that the facing electrodes 102 and 103 provided on the front surface and rear surface of the ion conducting actuator 100 face one end of the electrodes 107 and 108 respectively. At this time, a relationship between a width dimension of the groove 111 and a thickness width of the ion conducting actuator 100 is such that the width dimension of the groove 111 in the diagram is greater than the thickness width of the ion conducting actuator 100.

Without restricting to this, when the body to be mounted is flexible as the ion conducting actuator, the width dimension of the groove 111 may be somewhat smaller than the thickness width of the ion conducting actuator 100. At this time, when the ion conducting actuator 100 is inserted into the groove 111, due to the fitting of the groove 111 and the ion conducting actuator 100, it is possible to hold the ion conducting actuator 100 by the groove 111.

Moreover, as shown in FIG. 5, a part of the ion conducting actuator 100 has a notch 112. It is desirable that an amount of protrusion of the ion conducting actuator 100 held in the groove 111, from the substrate 109 has a height substantially same as a height of the bump 105 provided on the substrate 109. The amount of protrusion of the ion conducting actuator 100 from the substrate 109 is regulated by a depth of the groove 111 and a depth of the notch, and is determined by experiments or analysis.

Next, as shown in FIG. 6, the bumps 105 sandwich (pinch) the ion conducting actuator 100 along edges of the groove 111, and are provided in plurality. The bumps 105 and the electrodes 107 and 108 formed on a surface of the substrate 109 are made of an electroconductive metal such as platinum and gold which have excellent corrosion resistance, and through these electroconductive bumps 105, the facing electrodes 102 and 103 provided on the front and rear surface of the ion conducting actuator 100, and the electrodes 107 and 108 formed on the surface of the substrate 109 are connected electrically.

Moreover, the electrodes 107 and 108 on the surface of the substrate 109 are electrically unconnected, and are electrically connected to the flexible circuit board 110. Furthermore, power supply which is not shown in the diagram is electrically connected to the flexible circuit board 110.

Figure 7:
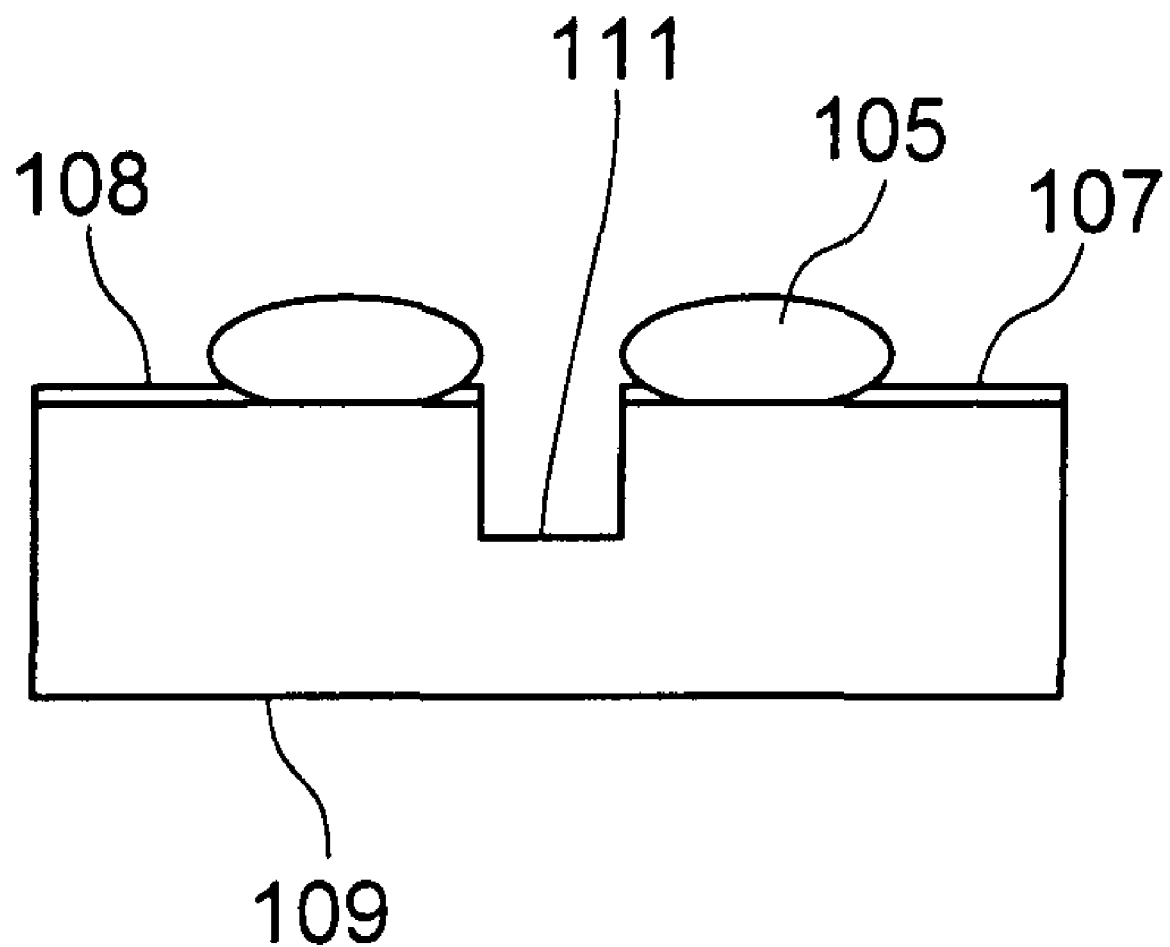
FIG. 7 is a diagram describing the electrical connections and a mechanical mounting method of the ion conducting actuator according to the first embodiment.

A method for electrical connections and mechanical mounting of the ion conducting actuator will be described by using FIG. 7 to FIG. 11. First of all, as shown in FIG. 7, after forming the electrodes 107 and 108 on the surface of the substrate 109 by a method such as a sputtering method, the groove 111 is provided at a central portion of the substrate 109 by a method such as dicing. The bumps 105 are formed in advance in plurality, to be facing mutually on the substrate 109, along the edges of the groove 111, by various bump formation methods.

Figure 8:
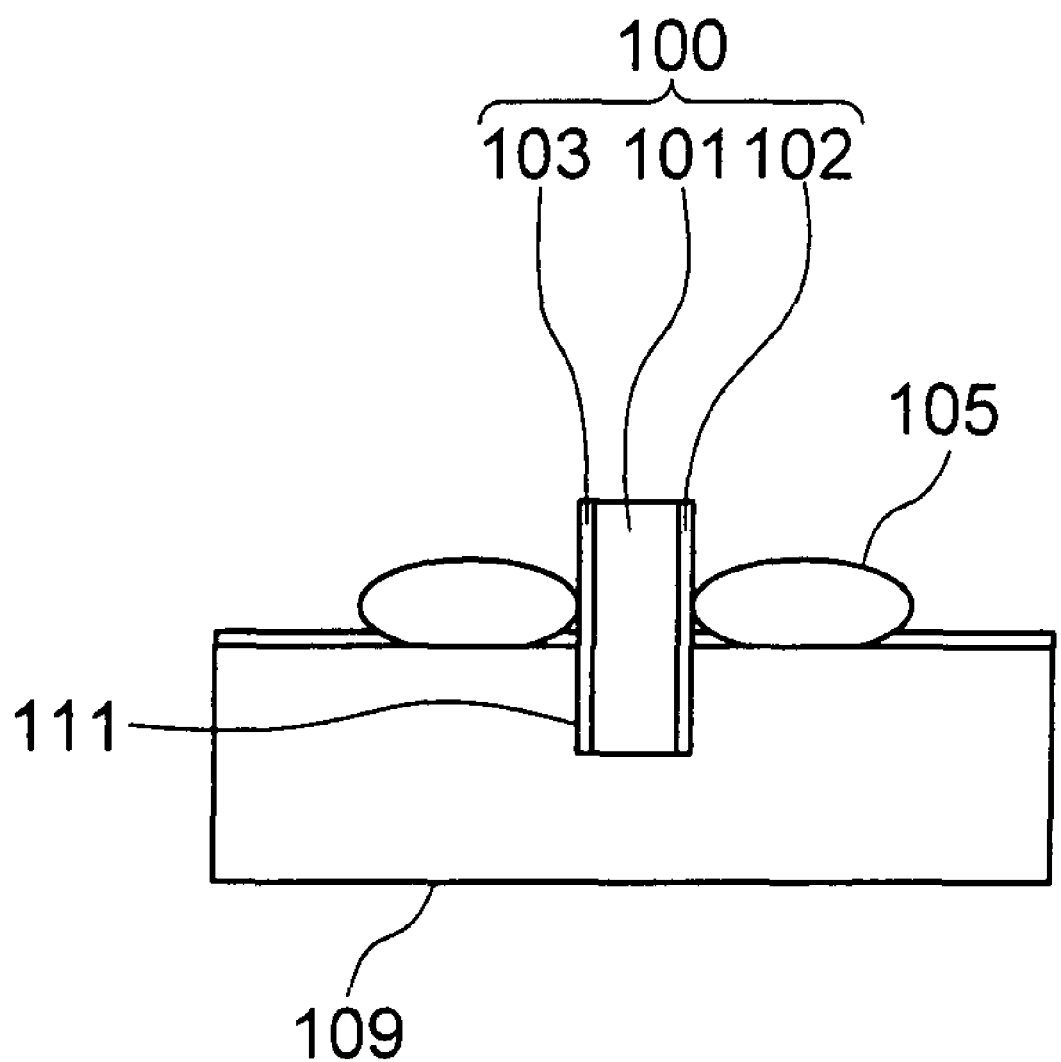
FIG. 8 is a diagram describing the electrical connections and the mechanical mounting method of the ion conducting actuator according to the first embodiment.
Figure 9:
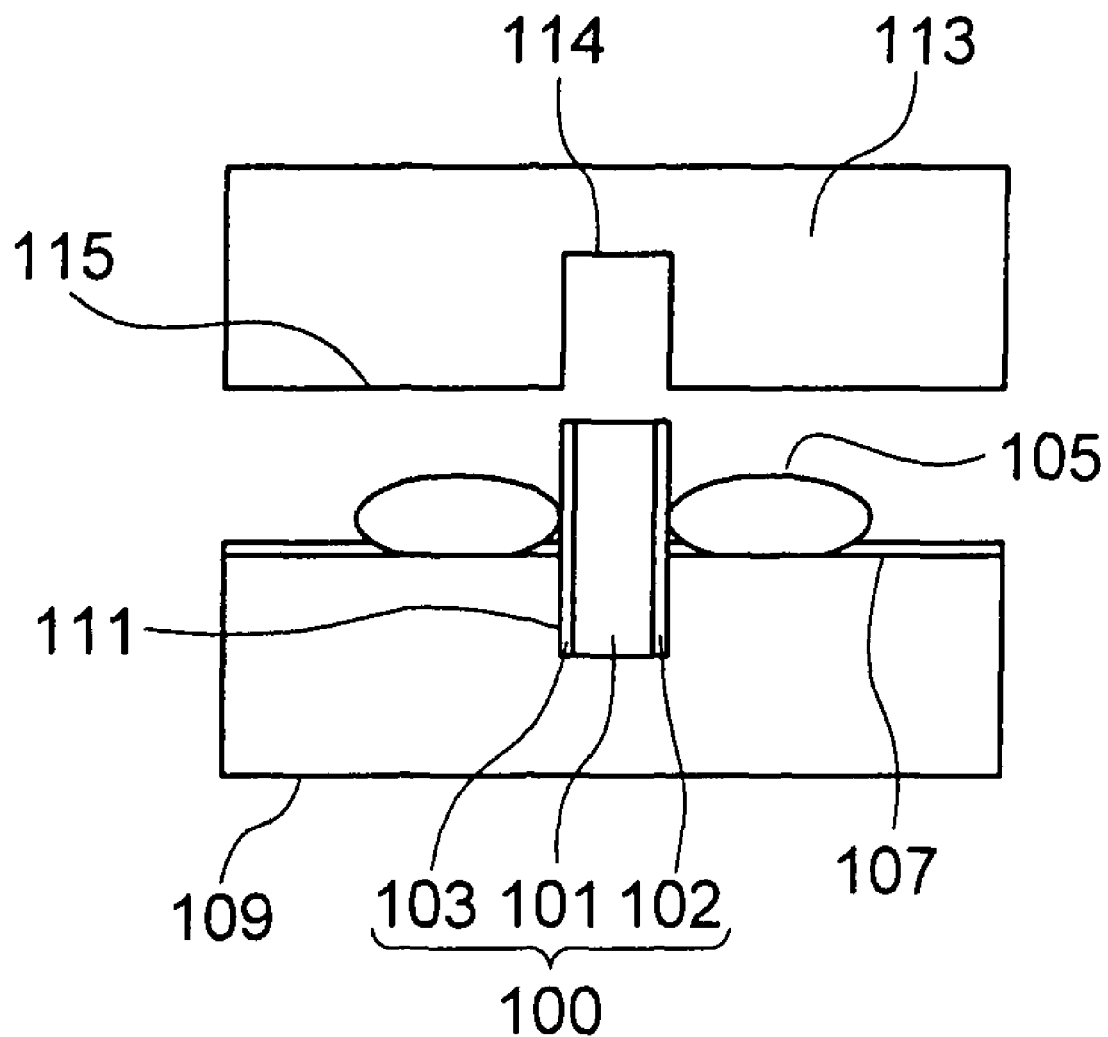
FIG. 9 is a diagram describing the electrical connections and the mechanical mounting method of the ion conducting actuator according to the first embodiment.
Figure 10:
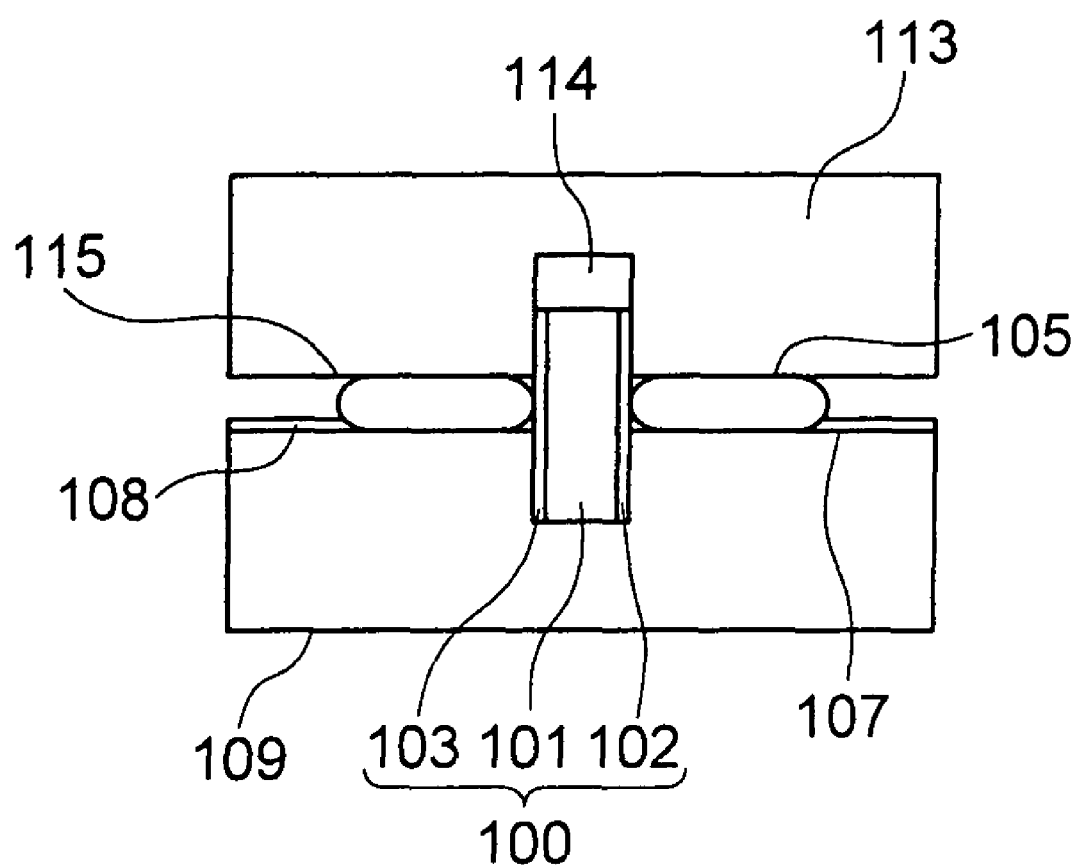
FIG. 10 is a diagram describing the electrical connections and the mechanical mounting method of the ion conducting actuator according to the first embodiment.

Next, as shown in FIG. 8, the ion conducting actuator 100 is inserted in the groove 111 provided at the central portion of the substrate 19 and temporary assembling is carried out. Thereafter, at a pressing step, as shown in FIG. 9 and FIG. 10, the bumps 105 are pressed by forcing in a direction of surface of the substrate 109 while carrying out leveling and thrust control, by a flat portion 115 of a pedestal 113 having a recess 114 which is provided such that the ion conducting actuator is not crushed.

Figure 11:
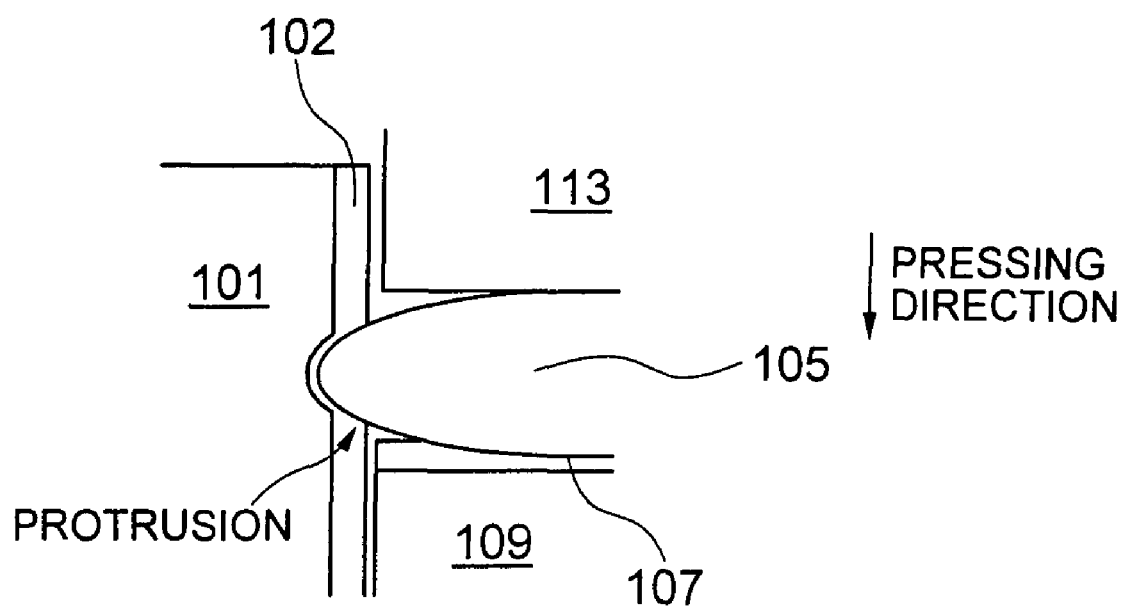
FIG. 11 is a diagram in which a part of FIG. 10 is shown to be enlarged.

At this time, at a formation step, since a deformation of the bumps 105 in a direction of pressing is constrained by the substrate 109, the bumps 105 which are pressed are deformed to be spread in a direction substantially perpendicular to the direction of pressing. With the deformation of the bumps 105, as shown in FIG. 11 which is a partially enlarged view of FIG. 10, an amount of deformation of the bump 105 is protruded toward the ion conducting actuator 100, and pushes the ion conducting actuator 100 by a predetermined thrust. The bumps 105 which are joining members deform at least a part of the facing electrodes 102 and 103. Moreover, since the bumps 105 disposed on opposite sides sandwiching the ion conducting actuator 100 push the ion conducting actuator 100 similarly, from a direction opposite to the direction of the bumps 105 in FIG. 11, the ion conducting actuator 100 is held mechanically from both sides.

Moreover, the facing electrodes 102 and 103 provided on the front surface and the rear surface of the ion conducting actuator 100 are electrically connected to the electrodes 107 and 108 provided on the surface of the substrate 109, via the bumps 105 which are electroconductive. This corresponds to a connecting step. The method for mounting according to the first embodiment is a method of connecting electrically and mechanically, by deforming in the direction substantially perpendicular to the direction of pressing of the bump, by pressing.

According to the method for mounting of the first embodiment, with a simple and low cost method, it is possible to carry out the electrical connections and the mechanical mounting of the ion conducting actuator with a high reliability, and to contribute to a reduction in size by enabling to mount in a small space due to simplification of the mounting structure.

Moreover, an effect peculiar to the first embodiment, is carrying out the connections by using the deformation of the bump due to pressing, and not connecting by melting and metallic bond which is a way in which the bumps are normally used. In this case, there is no effect of heat on the body to be mounted, when the bump is heated, and it is also possible to carry out the electrical connections and the mechanical mounting of the body to be mounted which is susceptible to have an effect of heat.

The present invention is not restricted to the first embodiment, and the body to be mounted is not restricted to an ion conducting actuator, and may be an actuator such as an actuator having an electrode and an actuator in which a piezoelectric body is used. Furthermore, it is not restricted to the actuator, and the body to be mounted may be let to be a sensor or a substrate.

Second Embodiment

Electrical connections and mechanical mounting structure of an ion conducting actuator according to a second embodiment will be described by using FIG. 12 and FIG. 13. Since components in the second embodiment which have been assigned the same reference numerals have the same structure as in the first embodiment, the repeated description of these components is omitted, and points of difference are described.

Figure 12:
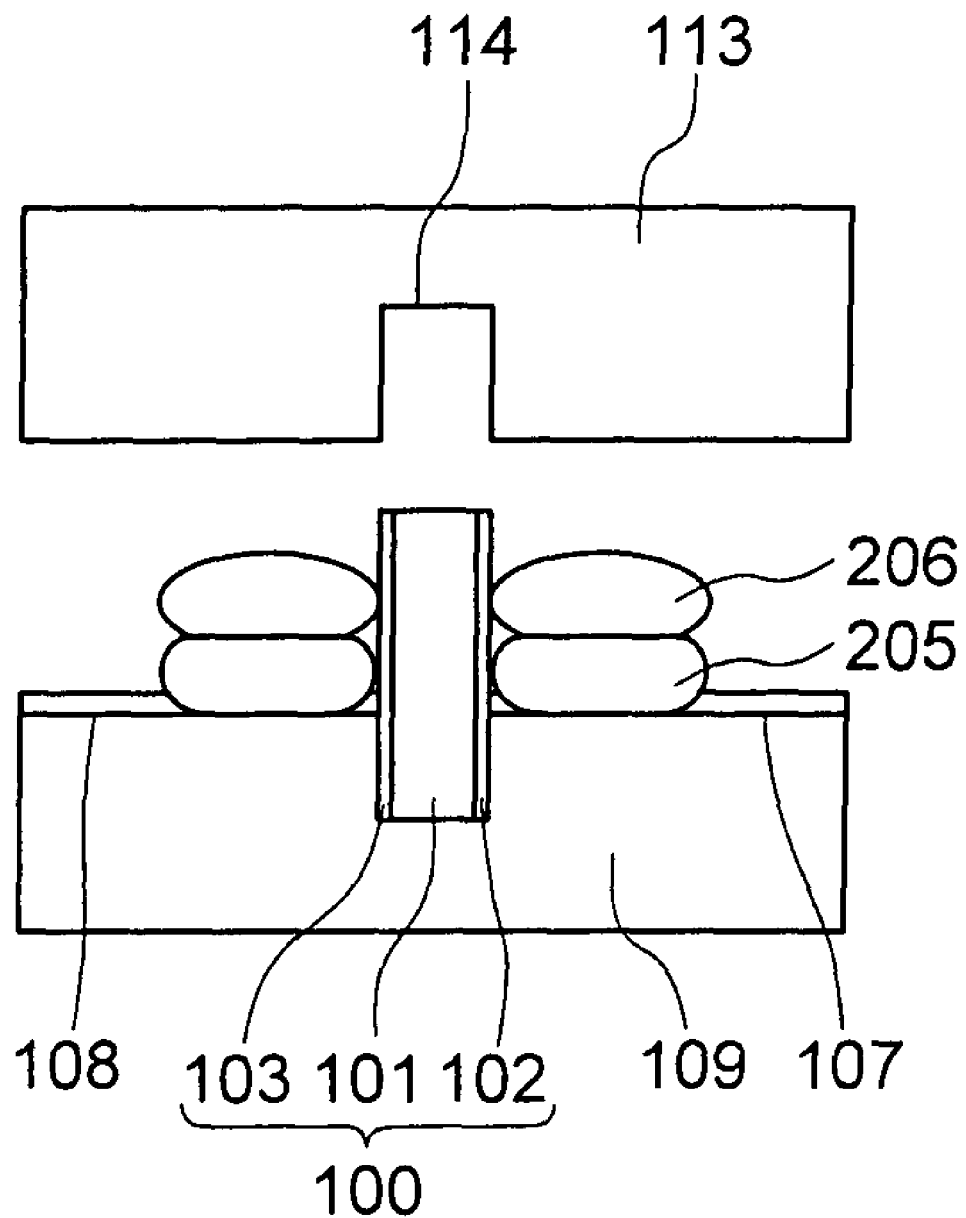
FIG. 12 is a diagram describing electrical connections and a mechanical mounting structure of an ion conducting actuator according to a second embodiment.

As shown in FIG. 12, the ion conducting actuator 100 includes the substrate 109 having the electrodes 107 and 108 on the surface, and the facing electrodes 102 and 103 provided on the front surface and the rear surface, and the flexible circuit board 110 which is not shown in the diagram which is similar as in the first embodiment, and has a structure in which bumps 205 and 206 are formed to be stacked in a plurality of stages (for example two stages) which is a characteristic of the second embodiment.

Figure 13:
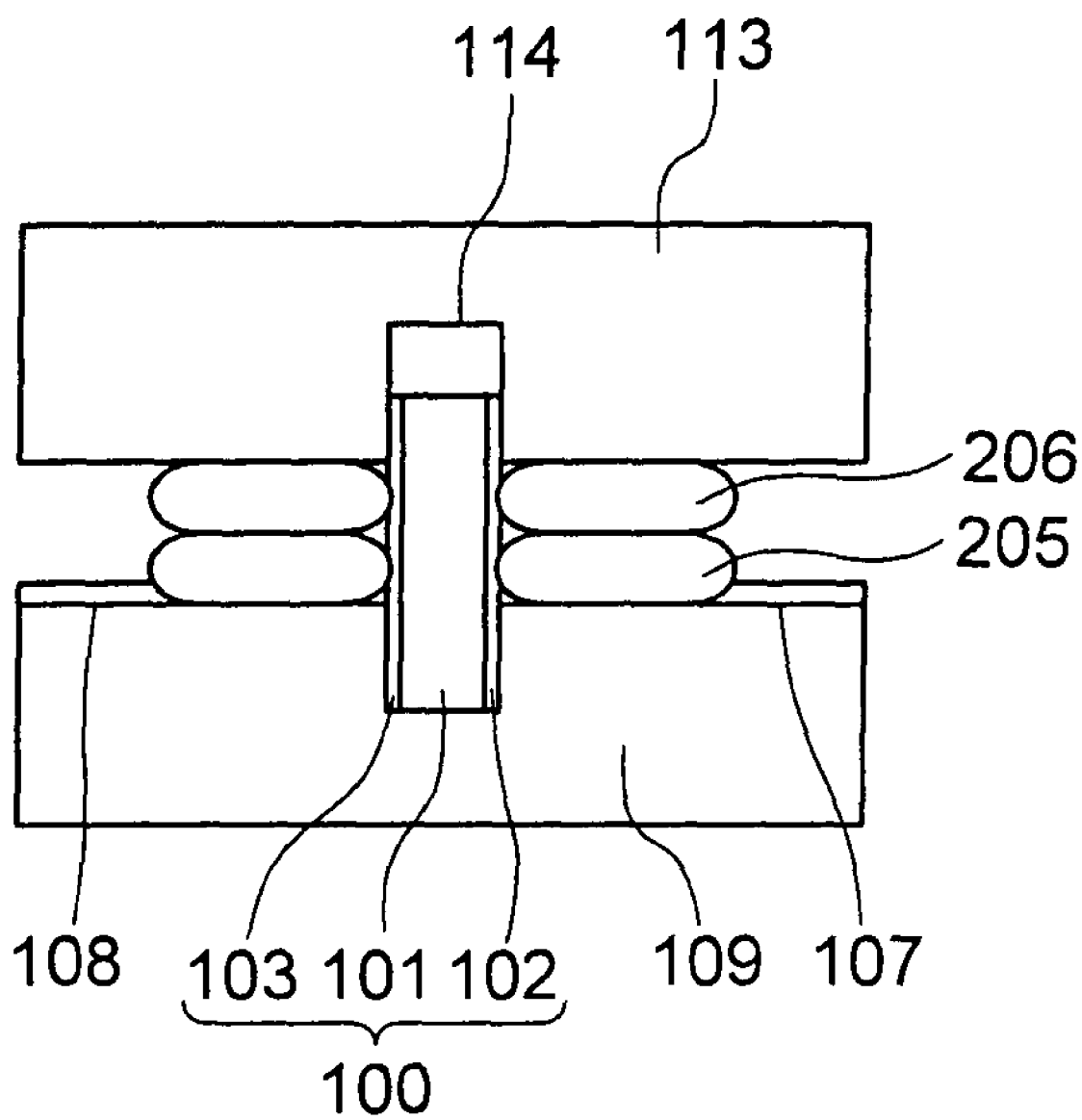
FIG. 13 is a diagram describing the electrical connections and the mechanical mounting structure of the ion conducting actuator according to the second embodiment.

Similarly as in the first embodiment, as shown in FIG. 13, the bumps 205 and 206 are deformed by pressing simultaneously by the flat portion 115 of the pedestal 113 having the recess 114 which is provided such that the ion conducting actuator 100 is crushed. At this time, a shape of the bumps 205 and 206 is deformed such that the deformation of the bumps 205 and 206 is spread in the direction substantially perpendicular to the direction of pressing.

With the deformation of these bumps 205 and 206, the ion conducting actuator 100 is sandwiched from both sides, and the ion conducting actuator 100 is held mechanically. In other words, the bumps 205 and 206 pinch the ion conducting actuator 100 by deforming at least a part of the facing electrodes 102 and 103. Moreover, the facing electrodes 102 and 103 provided on the front surface and the rear surface of the ion conducting actuator 100 are electrically connected to the electrodes 107 and 108 provided on the surface of the substrate 109 via the electroconductive bumps 205 and 206.

According to the second embodiment, an effect similar to the effect in the first embodiment is achieved, and as an effect peculiar to the second embodiment, by forming the bumps stacked in plurality of stages as the bumps 205 and 206, the bumps 205 and 206 are deformed, and a contact area holding the facing electrodes 102 and 103 on the front surface and the rear surface of the ion conducting actuator 100 is increased. Therefore, more stable electrical connections are achieved, and a force holding the ion conducting actuator 100 is increased, and it is possible to mount the actuator assuredly on the substrate.

The present invention is not restricted to the second embodiment, and the bumps to be stacked may be formed to be in two or more stages. Moreover, similarly as in the first embodiment, the body to be mounted is not restricted to an ion conducting actuator, and may be an actuator in which a piezoelectric body is used, provided that it is an actuator having an electrode. Furthermore, it is not restricted to the actuator, and the body to be mounted may be let to be a sensor or a substrate.

Third Embodiment

Electrical connections and a mechanical mounting structure of an ion conducting actuator according to a third embodiment will be described below by using FIG. 14 and FIG. 15. Since components in the third embodiment which have been assigned the same reference numerals have the same structure as in the first embodiment, the repeated description of these components is omitted, and points of difference are described.

Figure 14:
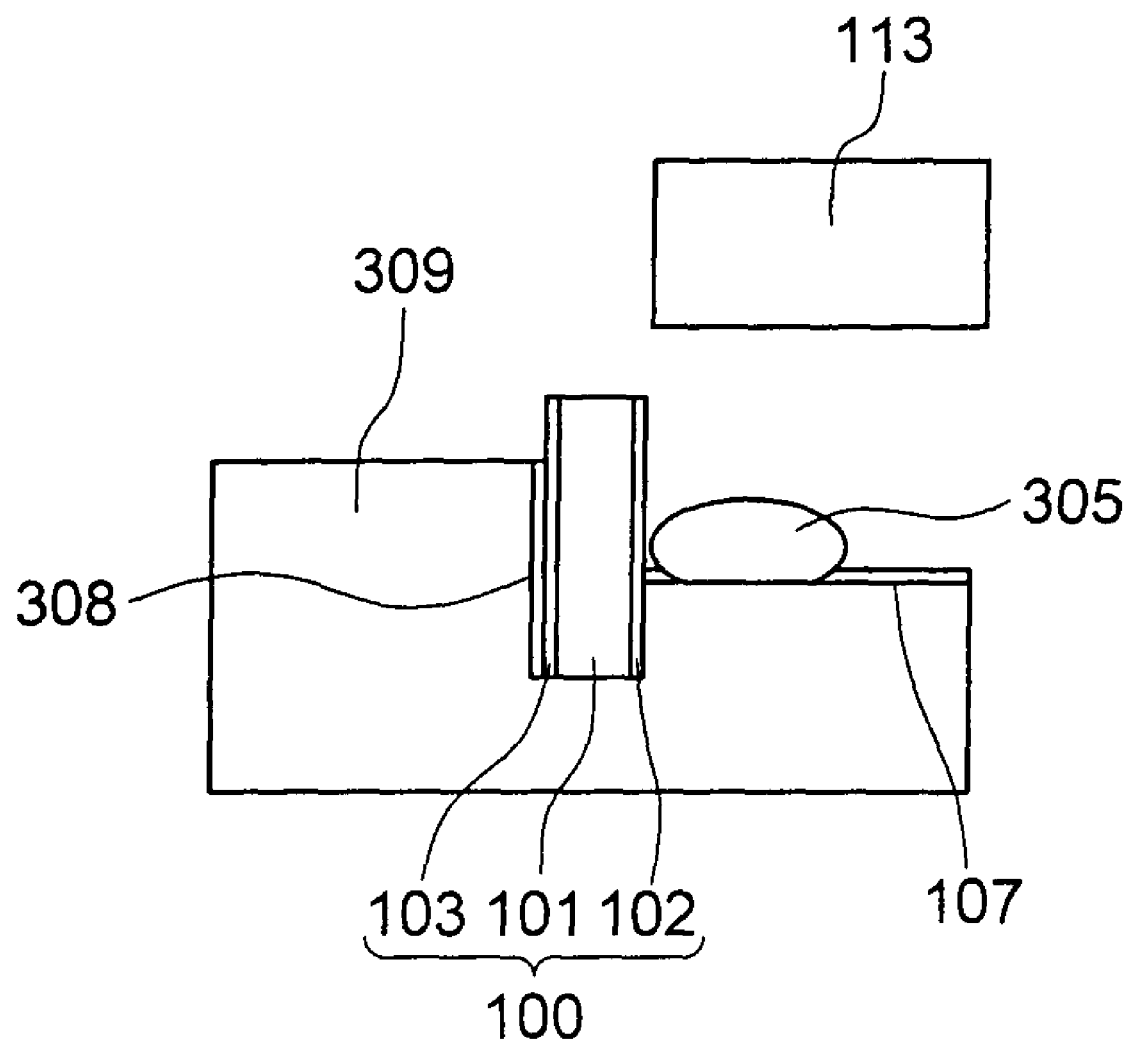
FIG. 14 is a diagram describing electrical connections and a mechanical mounting structure of an ion conducting actuator according to a third embodiment.
Figure 15:
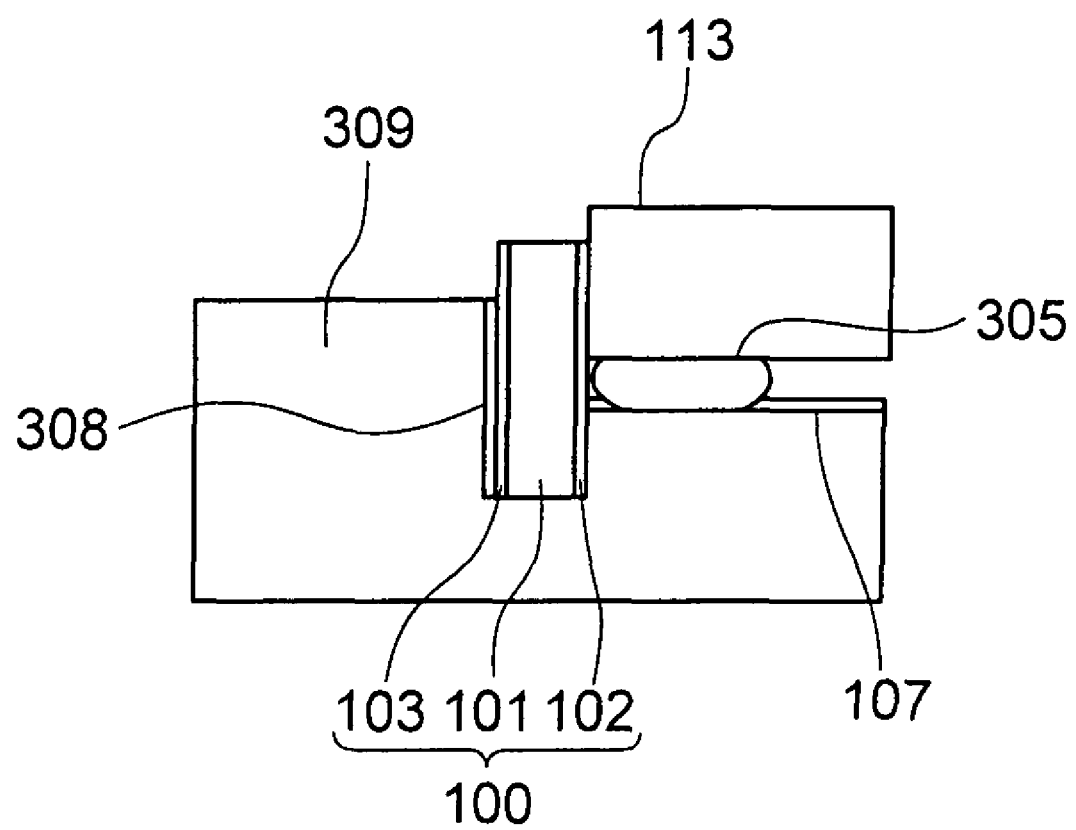
FIG. 15 is a diagram describing the electrical connections and the mechanical mounting structure of the ion conducting actuator according to the third embodiment.

As shown in FIG. 14, the mounting structure includes a substrate 309 having a cross-section which is substantially L-shaped, which is a peculiarity of the third embodiment, and an electrode 308 which is provided on a wall surface of the substrate 309 facing the facing electrode 103 out of the facing electrodes 102 and 103 provided on the front surface and rear surface of the ion conducting actuator 100, and faces the other facing electrode 102 provided on the surface of the ion conducting actuator 100, and includes a bump 305 provided on the electrode 109 on the surface of the substrate 309.

According to the third embodiment having such a structure, in addition to achieving an effect same as the effect in the first embodiment, as an effect peculiar to the third embodiment, since the electrode 308 provided on the wall surface of the substrate 309 is facing the ion conducting actuator 100, by deforming the single bump 305 by pressing, it is possible to carry out the electrical connections and the mechanical mounting of the ion conducting actuator 100, and it is possible to mount in a small space due to the mounting structure being simplified.

The present invention is not restricted to the third embodiment, and the bumps which are stacked may be formed in two or more than two stages, with the purpose similar as FIG. 12 and FIG. 13. Moreover, similarly as in the first embodiment, the body to be mounted is not restricted to an ion conducting actuator, and may be an actuator in which a piezoelectric body is used. Furthermore, it is not restricted to the actuator, and the body to be mounted may be let to be a sensor or a substrate.

As it has been mentioned above, the mounting structure of the actuator and the method for mounting according to the present invention are useful in fields such as mechanical equipments, industrial robots, and micro machines.

According to the mounting structure of the actuator and the method for mounting according to the present invention, it is possible to realize the stable and assured electrical connections and the mechanical connections with a simple and low cost structure.

What is claimed is:

1. A mounting structure of an actuator comprising:
an actuator which has a first electrode;
a substrate which has a second electrode; and
a joining member which is deformable and electro conductive, wherein the joining member is pressed toward the substrate, and via a deformation of the joining member which is deformed to be spread in a direction substantially perpendicular to the direction of pressing, the actuator and the substrate are connected mechanically, and the first electrode and the second electrode are connected electrically.

2. The mounting structure of the actuator according to claim 1, wherein the first electrode of the actuator is provided on each of a front surface and a rear surface.

3. The mounting structure of the actuator according to claim 2, wherein a plurality of joining members are formed to be facing mutually on the substrate, sandwiching the actuator.

4. The mounting structure of the actuator according to claim 3, wherein the joining member is an electroconductive bump formed by a bump formation method.

5. The mounting structure of the actuator according to claim 4, wherein the actuator is an ion conducting actuator which includes a base material which is made of a high-polymer material, and facing electrodes which are formed on a surface of the base material.

6. The mounting structure of the actuator according to claim 5, wherein the joining member pinches the actuator by deforming at least a part of the facing electrodes.

7. The mounting structure of the actuator according to claim 6, wherein the second electrode and the electroconductive bump are formed of a noble metal such as gold and platinum.

8. The mounting structure of the actuator according to claim 2, wherein
the joining member is an electroconductive bump formed by a bump formation method.

9. The mounting structure of the actuator according to claim 8, wherein the actuator is an ion conducting actuator which includes a base material which is made of a high-polymer material, and facing electrodes which are formed on a surface of the base material.

10. The mounting structure of the actuator according to claim 9, wherein the joining member pinches the actuator by deforming at least a part of the facing electrodes.

11. The mounting structure of the actuator according to claim 10, wherein the second electrode and the electroconductive bump are formed of a noble metal such as gold and platinum.

12. A mounting structure of an actuator comprising:
an actuator which has a first electrode;
a substrate which has a second electrode; and
a joining member which is deformable and electroconductive, wherein
the joining member is pressed toward the substrate, and via a deformation of the joining member toward the actuator, the actuator and the substrate are connected mechanically, and
the first electrode and the second electrode are connected electrically, and
the first electrode of the actuator is provided on each of a front surface and a rear surface, and
a plurality of joining members are formed to be mutually facing on the substrate, pinching the actuator, and
the joining member is pressed, and is deformed in a direction perpendicular to a direction in which the joining member is pressed, and pinches the actuator, and
the joining member is an electroconductive bump formed by a bump formation method, and
the electroconductive bumps are formed to be stacked in a plurality of stages facing mutually, pinching the actuator.

13. The mounting structure of the actuator according to claim 12, wherein the actuator is an actuator which includes a base material which is made of a high-polymer material, and facing electrodes which are formed on a surface of the base material.

14. The mounting structure of the actuator according to claim 13, wherein the joining member pinches the actuator by deforming at least a part of the facing electrodes.

15. The mounting structure of the actuator according to claim 12, wherein the second electrode and the electroconductive bump are formed of a noble metal such as gold and platinum.

16. A method for mounting an actuator in which, an actuator having a first electrode is mounted on a substrate having a second electrode comprising:

a pressing step at which, a joining member which is deformable and electroconductive is pressed toward the substrate;

a deformation step at which, the joining member is deformed which is deformed to be spread in a direction substantially perpendicular to the direction of pressing; and a connecting step at which, the actuator and the substrate are connected mechanically, and the first electrode and the second electrode are connected electrically, by the joining member which is deformed.

* * * * *